United States Patent [19]

Kurland et al.

[11] Patent Number: 4,755,231
[45] Date of Patent: Jul. 5, 1988

[54] FLEXIBLE SOLAR ARRAY CELL AND SUBSTRATE THEREFOR

[75] Inventors: Richard M. Kurland, Sherman Oaks; Ira L. Allard, Rancho Palos Verdes; Rebecca C. Chaky, Moorpark; George T. Inouye, deceased, late of Rancho Palos Verdes, all of Calif., by Marlene M. Inouye, executrix

[73] Assignee: TRW Inc., Redondo Beach, Calif.

[21] Appl. No.: 873,895

[22] Filed: Jun. 13, 1986

[51] Int. Cl.⁴ .................. H01L 25/02; H01L 27/14
[52] U.S. Cl. ............................. 136/244; 136/245; 136/292
[58] Field of Search ............. 136/244, 245, 292; 428/922, 457–458, 328, 473.5

[56] References Cited

PUBLICATIONS

J. Koch et al., *Conference Record*, 13th *IEEE Photovoltaic Specialists Conference* (1978), pp. 215–220.
D. Rüsch, *Proc. European Symposium on Photovoltaic Generators in Space* (1978), pp. 41–48.

*Primary Examiner*—Aaron Weisstuch
*Attorney, Agent, or Firm*—Noel F. Heal; Thomas N. Giaccherini

[57] ABSTRACT

A substrate structure for lightweight, flexible solar cell arrays, in which a plastic substrate is provided with a structure for discharging accumulations of electrons on its rear face and has appropriate heat emmissivity properties. In one embodiment, a Kapton substrate layer is coated with a grounded aluminum layer, which is suitably painted for emissivity. In another embodiment, a poorly conductive Kapton substrate layer, impregnated with carbon, is used to dissipate the charge, and to provide the appropriate emissivity. In a third embodiment, a grounded VDA layer is sandwiched between two Kapton layers.

9 Claims, 1 Drawing Sheet

FLEXIBLE SOLAR ARRAY CELL AND SUBSTRATE THEREFOR

BACKGROUND OF THE INVENTION

This invention relates generally to solar arrays and, more particularly, to flexible, lightweight solar arrays for use on spacecraft. The use of solar arrays to provide electrical power to satellites and other spacecraft poses a number of related electrical, mechanical, and thermal problems.

In general, a solar array is continuously pointed toward the sun. In this orientation, the rear face of the array, facing away from the sun, accumulates an electrical charge from the space plasma, which eventually exceeds the breakdown threshold between the array and the spacecraft "ground." Unless protective means are provided, the build-up of charge on the rear face of the array will cause periodic arching discharges between the array and the spacecraft ground. The breakdown voltage may be as high as 10 kv (kilovolts), and the occurrence of arcing discharges is undesirable since the discharges may affect the operation and reliability of the array and the equipment it powers.

Coating the rear face of the array with a grounded metal layer solves this problem, but raises another one in that the metal layer can degrade the thermal performance of the array. Since the array receives solar radiation on its front face, and converts only a small fraction of the radiation to electrical power, the array must be capable of re-radiating a large amount of energy from its rear face.

Grounding layers have been used on relatively rigid solar arrays and on lightweight blanket-type arrays. A rigid array with a conductive paint layer on the rear face is described in "TDRSS Solar Array Design Guidelines for Immunity to Geomagnetic Substorm Charging Effects," by G. T. Inouye and J. M. Sellen, Jr., *Proc. Thirteenth IEEE Photovoltai Specialists Conf.*, June 5–8, 1978. In the structure described in this paper, solar cells are supported on a rigid and grounded aluminum honeycomb substrate, which has on its rear face a layer of Kapton coated with conductive paint.

Lightweight solar arrays are typically supported on a flexible substrate of Kapton, a polyimide film material manufactured by the Du Pont de Nemours company. The Kapton substrate can be rolled or folded for transport into space, and later deployed into a flat sheet or other desired shape, supported on a rigid frame. It has been suggested in U.S. Pat. No. 4,043,834 issued in the name of Rusch, that the rear face of a Kapton substrate used in a solar array be coated with an adhesive impregnated with a conductive material. However, the patent makes no reference to possible thermal problems.

Another suggestion of the prior art is to be found in UK Patent Application No. 2 062 189 A, which describes a Kapton blanket structure in which a first conductive layer is sandwiched between two Kapton layers, and an optional second conductive layer is coated on the rear face of the substrate structure. Adhesive is the suggested form of the first conductive layer, and the optional rear-face layer is described as vacuum-deposited or painted.

UK Patent Application No. 2 100 510 A describes an approach in which an indium-tin-oxide (ITO) conductive layer is formed on both the front and rear faces of a solar array, and is further coated with a Kapton layer. Accordingly, there is no conductive layer on the rear face and no consideration is given to thermal problems.

It will be appreciated from the foregoing that there is still need for improvement in the field of solar arrays subject to space charge build-up and thermal problems. The present invention provides a simple but highly effective solution to these problems.

SUMMARY OF THE INVENTION

The present invention resides in a lightweight solar array structure that simultaneously addresses the problem of accumulated charge on the rear face of the array, and the related problem of suitably re-radiating heat from the rear face. Briefly, and in general terms applicable to all of the disclosed embodiments of the invention, the substrate structure of the invention includes flexible plastic substrate means for supporting an array of interconnected solar cells on its front face, and additional means formed integrally with the substrate, for providing a ground path for electric charge building up at the rear face of the substrate, and means for providing a suitable heat emissive surface at the rear face.

In a first of the illustrated embodiments, the additional means includes a grounded conductive layer formed on the rear surface of the substrate means, and a layer of paint applied to the conductive layer to provide the required heat emission properties. In a second embodiment, the additional means includes an impregnation of conductive material within the substrate means, to provide the necessary path for accumulated electric charge and to provide the necessary color to the rear surface of the substrate means. In a third embodiment, the additional means includes a grounded conductive layer disposed within the substrate means, and an impregnation of conductive particles within the substrate means, to enhance the conductive discharge path and to provide the required heat emissivity.

More specifically, in the first embodiment of the invention, the substrate, which takes the form of a layer of Kapton, has a layer of aluminum vapor-deposited on its rear face. To provide the necessary thermal emissivity, the aluminum layer is coated with a thin layer of thermal control paint. Although the paint is not highly conductive, its thickness is small enough to provide a low resistance current path to the aluminum layer and thence to ground.

In the second embodiment, the substrate is a sheet of carbon-impregnated Kapton, which has a resistivity low enough to keep accumulated charge voltages to a reasonably low level, but high enough not to effectively "short out" the solar cells. Since the material is black in color, it also provides the required emissivity for an array positioned some distance from the earth, such as in geosynchronous orbit.

The third embodiment is similar to the second, but includes an intermediate grounded aluminum layer between two Kapton layers. The aluminum layer provides solid grounding, while the Kapton layers function in the same manner as in the second embodiment.

It will be appreciated from the foregoing that the present invention represents a significant advance in the field of lightweight, flexible solar arrays. In particular, the invention simultaneously provides a grounding path for accumulated charge on the rear face of an array, and provides an appropriate re-radiating surface for the rear face. Other aspects and advantages of the invention will become apparent from the following more detailed description, taken in conjunction with the accompanying drawings.

DESCRIPTION OF THE PREFERRED EMBODIMENTS

Figure 1:
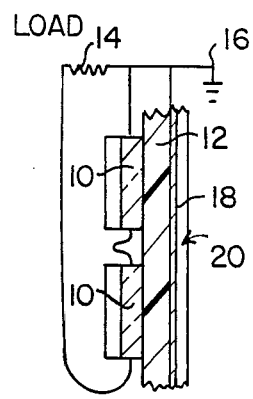
FIG. 1 is a simplified cross-sectional view of a first embodiment of the invention.

As shown in the drawings for purposes of illustration, the present invention is concerned with support substrates for flexible, lightweight solar arrays, especially arrays for use in space. When a solar array is faced toward the sun, a well known phenomenon results in the build-up of electrical charge on the rear face of the array, i.e. the one facing away from the sun. Unless this accumulating charge is harmlessly grounded, there will be occasional arcing between the substrate and the spacecraft, and this may result in malfunctioning of the array or of other equipment on the spacecraft.

In accordance with the invention, the support substrate for a lightweight solar array includes means for both discharging the accumulated charge on the rear face of the substrate, and for re-radiating sufficient heat from the rear face to allow for stable operation of the array.

FIG. 1 shows two of a plurality of solar cells, indicated by reference numeral 10, supported on a flexible substrate 12, which is typicaly a plastic polyimide film known as Kapton. The substrate 12 is flexible, and may be conveniently rolled or folded for transportation prior to deployment of the array in space. As shown diagrammatically, the cells 10 are interconnected and coupled electrically to a load 14, one terminal of which is connected to the ground bus 16 of the spacecraft.

To provide for discharge of any accumulated charge on the rear face of the substrate 12, a vapordeposited-aluminum (VDA) layer 18 is applied to the substrate and is connected to ground 16. Since the aluminum layer 18 would not provide a suitable heat emissivity for the rear face, a layer of thermal paint 20 is applied over the VDA layer 18. The paint is preferably black for use in high earth-orbits, where reflected light from the earth has little effect. In low-altitude orbits the rear face of the array is periodically subject to significant reflected radiation from the earth, and white is then the preferred paint color.

Figure 2:
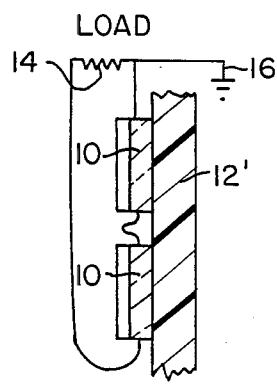
FIG. 2 is a simplified cross-sectional view of a second embodiment of the invention.

FIG. 2 shows a second preferred embodiment of the invention, in which the VDA layer and the paint layer are not needed. The substrate 12' is, in this embodiment, a "poorly" conductive plastic material. Since the properties of Kapton are well suited for use as a solar array substrate, the best material for this purpose is Kapton with an impregnation of carbon soot. The Du Pont designation is Kapton 200 XA-C37, which has 37% of carbon by weight, and a measured resistivity of $1.7 \times 10^{12}$ ohm-cm. This resistivity is sufficiently low to provide for the discharge of electrons that would otherwise build up on the rear face of the substrate, but is high enough to prevent any significant "shorting" of the cells 10 through the substrate 12'.

Since each cell 10 effectively "soaks up" electrons from the portion of the substrate with which it is in contact, the only other voltage build-up problems to be considered are those arising from a current path along the length of the substrate between cells, and from a current path through the thickness of the substrate.

If the sheet is assumed to be irradiated with electrons having a current density of J, the voltage generated across a length L of the substrate 12' is given by:

$$V = \tfrac{1}{2} J L^2 \rho / t,$$

where L is the length and $\rho$ is the sheet resistivity. If J is assumed to be 0.3 nA (nanamperes)/cm², V is assumed to be limited to around 100 volts to avoid arcing breakdowns, L is assumed to be 1 mm, which is half the distance between adjacent cells, and t is 6 mils (0.006 inch), then the required minimum value of $\rho$ can be calculated from the above equation to be $1.02 \times 10^{12}$ ohm-cm. With the measured value of $1.7 \times 10^{12}$ ohm-cm, the voltage value is still less than 200 volts.

The voltage drop across the thickness of the substrate is of less concern. The bulk resistance across the thickness can be calculated out to $2.6 \times 10^{10}$ ohms/cm², and for the same value of J as used above the voltage drop is only 7.7 volts. For typical resistivity values of adhesives, the voltage drop across an adhesive layer between the cells and the substrate is approximately 160 volts, which is an acceptable value. Likewise, the use of an adhesive between two adjacent layers of substrate would interpose another 160-volt voltage drop, but should also be acceptable.

Leakage of current between solar cells through the substrate 12' is insignificant compared with the load current of the cells. The leakage current is estimated to be about one nanoampere, compared with cell output currents measured in hundreds of milliamperes. In other words, the difference is about eight orders of magnitude.

The black color of the carbon-impregnated Kapton provides the appropriate emissivity properties for use in a high orbit, without the need for application of a paint layer. At lower orbits, a thin white paint layer may be necessary.

Figure 3:
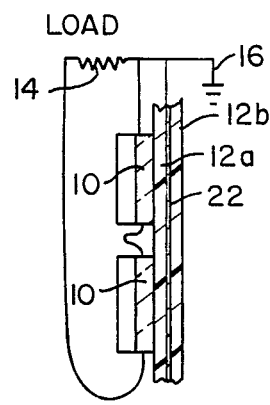
FIG. 3 is a simplified cross-sectional view of a third embodiment of the invention.

The third embodiment of the invention, shown in FIG. 3, includes two layers of Kapton, indicated at 12a and 12b, separated by a grounded layer of vapordeposited aluminum (VDA) 22. The rear Kapton layer 12b, which is carbon-impregnated, provides the requisite emissivity and has its accumulated electron charge absorbed by the VDA layer 22. The intermediate Kapton layer 12a is needed to insulate the VDA layer from the solar cells 10, which would otherwise be shorted by the conductive aluminum.

It will be appreciated from the foregoing that the present invention represents a significant advance over other solar cell substrates. In particular, the invention, provides for the discharge of accumulated electrons on the rear face of the array, and provides an appropriate emissivity for the rear face. It will also be appreciated that, although a limited number of embodiments of the invention have been described in detail for purposes of illustration, various modifications may be made without departing from the spirit and scope of the invention. Accordingly, the invention is not to be limited except as by the appended claims.

We claim:

1. A flexible, lightweight solar array substrate structure, comprising:

flexible plastic substrate means for supporting an array of interconnected solar cells on its front face;

additional means formed integrally with the substrate, for providng a ground path for electric charge building up on the rear face of the substrate and for providing a suitable heat emissive surface at the rear face, the additional means including a groundable conductive layer formed on the rear face of the substrate means and a layer of paint applied to the conductive layer to provide the required heat emission properties.

2. A flexible, lightweight solar array. comprising:
an array of interconnected solar cells;
flexible plastic substrate means supporting the array of solar cells on its front face; and
additional means formed integrally with the substrate, for providing a ground path for electric charge building up on the rear face of the substrate and for providing a suitable heat emissive surface at the rear face, the additional means including an impregnation of conductive material within the substrate means, to provide the necessary path for accumulated electric charge and to provide the necessary color to the rear surface of the substrate means.

3. A flexible, lightweight solar array substrate structure, comprising:
flexible plastic substrate means for supporting an array of interconnected solar cells on its front face;
additional means formed integrally with the substrate, for providing a ground path for electric charge building up on the rear face of the substrate and for providng a suitable heat emissive surface at the rear face, the additional means including a groundable conductive layer formed on the rear face of the substrate means and a further substrate layer impregnated with a conductive material and positioned on the rear face of the conductive layer.

4. A lightweight, flexible solar array substrate structure, comprising:
an insulating plastic substrate having a rear face, and a front face for supporting a plurality of solar cells;
a groundable vapor-deposited layer of conductive material formed on the rear face of the substrate, to dissipate accumulations of electrical charge on the substrate; and
a layer of thermal paint applied to the layer of conductive material to provide appropriate emissivity properties.

5. A structure as defined in claim 4, in which:
the substrate is of Kapton; and
the conductive layer is vapor-deposited aluminum (VDA).

6. A lightweight, flexible solar array, comprising:
a plurality of solar cells;
a poorly conductive, flexible plastic substrate layer having a rear surface, and a front surface supporting the plurality of solar cells, the substrate being impregnated with particles of conductive material, to provide a resistivity sufficiently low to discharge electrons accumulated on the substrate, but sufficiently high to avoid short-circuiting the cells;
and in which the substrate material is of a suitable color to provide the required emissivity properties.

7. A structure as defined in claim 6, in which:
the substrate is black, carbon-impregnated Kapton with approximately 37% carbon by weight.

8. A lightweight, flexible solar array substrate structure, comprising:
a first plastic substrate film having a rear face, and a front face for supporting an array of solar cells;
a groundable metal layer vapor-deposited on the rear face of the first plastic substrate film; and
a second plastic substrate film positioned over the layer of metal and impregnated with conductive particles to provide charge transfer to the grounded metal layer and to provide appropriate emissivity properties to the substrate structure.

9. A structure as defined in claim 8, in which:
the first substrate film is of Kapton;
the metal layer is vapor-deposited aluminum (VDA); and
the second substrate film is of Kapton impregnated with carbon.

* * * * *